(12) United States Patent
Tarsa et al.

(10) Patent No.: US 8,563,339 B2
(45) Date of Patent: Oct. 22, 2013

(54) SYSTEM FOR AND METHOD FOR CLOSED LOOP ELECTROPHORETIC DEPOSITION OF PHOSPHOR MATERIALS ON SEMICONDUCTOR DEVICES

(75) Inventors: Eric J. Tarsa, Goleta, CA (US); Michael Leung, Ventura, CA (US); Bernd Keller, Santa Barbara, CA (US); Robert Underwood, Santa Barbara, CA (US); Mark Youmans, Santa Barbara, CA (US)

(73) Assignee: Cree, Inc., Goleta, CA (US)

( * ) Notice: Subject to any disclaimer, the term of this patent is extended or adjusted under 35 U.S.C. 154(b) by 915 days.

(21) Appl. No.: 11/473,089

(22) Filed: Jun. 21, 2006

(65) Prior Publication Data
US 2007/0158668 A1 Jul. 12, 2007

Related U.S. Application Data

(60) Provisional application No. 60/711,590, filed on Aug. 25, 2005.

(51) Int. Cl.
| | |
|---|---|
| H01L 21/00 | (2006.01) |
| H01L 21/326 | (2006.01) |
| H01L 21/479 | (2006.01) |
| H01L 21/20 | (2006.01) |
| H01L 21/36 | (2006.01) |
| H01L 21/31 | (2006.01) |
| H01L 21/469 | (2006.01) |

(52) U.S. Cl.
USPC ............ 438/29; 438/33; 438/34; 438/35; 438/465; 438/466; 438/478; 438/765

(58) Field of Classification Search
USPC .......... 438/478, 500, 497, 492, 29, 758–794, 438/584–688, 33–35, 465, 466; 209/915; 204/88, 147, 148, 316, 766, 799; 205/88, 147, 148, 316, 766, 799
See application file for complete search history.

(56) References Cited

U.S. PATENT DOCUMENTS

| | | | | |
|---|---|---|---|---|
| 5,813,753 | A | 9/1998 | Vriens et al. | 362/293 |
| 5,959,316 | A | 9/1999 | Lowery | 257/98 |
| 6,197,182 | B1 * | 3/2001 | Kaufman et al. | 205/159 |
| 6,803,092 | B2 * | 10/2004 | Pocius et al. | 428/209 |
| 6,833,063 | B2 * | 12/2004 | Basol | 205/668 |
| 6,924,233 | B1 | 8/2005 | Chua et al. | 438/678 |

(Continued)

FOREIGN PATENT DOCUMENTS

| | | |
|---|---|---|
| EP | 1198016 A2 | 10/2001 |
| EP | 1198016 A2 | 4/2002 |

(Continued)

OTHER PUBLICATIONS

Nichia Corp. White LED, Part No. NSPW312BX, "Specifications for Nichia White LED, Model NSW312BS", pp. 1-14, 2004.

(Continued)

*Primary Examiner* — Phat X Cao
*Assistant Examiner* — Diana C Vieira
(74) *Attorney, Agent, or Firm* — Koppel, Patrick, Heybl & Philpott

(57) ABSTRACT

One close loop system and method for electrophoretic deposition (EPD) of phosphor material on light emitting diodes (LEDs). The system comprises a deposition chamber sealed from ambient air. A mixture of phosphor material and solution is provided to the chamber with the mixture also being sealed from ambient air. A carrier holds a batch of LEDs in the chamber with the mixture contacting the areas of the LEDs for phosphor deposition. A voltage supply applies a voltage to the LEDs and the mixture to cause the phosphor material to deposit on the LEDs at the mixture contacting areas.

17 Claims, 14 Drawing Sheets

(56) References Cited

U.S. PATENT DOCUMENTS

| | | |
|---|---|---|
| 2003/0079989 A1* | 5/2003 | Klocke et al. .............. 204/471 |
| 2004/0256974 A1 | 12/2004 | Mueller-Mach et al. |
| 2005/0062140 A1 | 3/2005 | Leung et al. |
| 2005/0176230 A1* | 8/2005 | Sieber et al. .............. 438/609 |

FOREIGN PATENT DOCUMENTS

| | | |
|---|---|---|
| EP | 1267424 A2 | 12/2002 |
| JP | 2003-110153 | 4/2003 |
| WO | WO 2004/020704 | 3/2004 |

OTHER PUBLICATIONS

Nichia Corp. White LED, Part No. NSPW300BS, "Specifications for Nichia White LED Model NSPW300BS", pp. 1-14, 2004.

International Preliminary Report on Patentability dated: Jun. 12, 2008. PCT/US06/24884.

Notice of Rejection from Japanese counterpart application No. 2008-527912, dated: Jun. 5. 2012.

Notice of Rejection for counterpart Japanese Patent Application No. 2008-527912 issued Jun. 14, 2011.

\* cited by examiner

SYSTEM FOR AND METHOD FOR CLOSED LOOP ELECTROPHORETIC DEPOSITION OF PHOSPHOR MATERIALS ON SEMICONDUCTOR DEVICES

This application claims the benefit of U.S. provisional application Ser. No. 60/711,590 to Tarsa et al., which was filed on Aug. 25, 2005.

This invention was made with Government support under NIST (ATP) Contract No. 70NANB4H3037. The Government has certain rights in this invention.

BACKGROUND OF THE INVENTION

1. Field of the Invention

This invention relates to electrophoretic deposition of semiconductor devices and more particularly to electrophoretic deposition of light emitting diodes (LEDs) with a phosphor using a close loop system.

2. Description of the Related Art

LEDs are solid-state devices that convert electric energy to light and they generally comprise an active layer of semiconductor material sandwiched between two oppositely doped layers. When a bias is applied across the doped layers, holes and electrons are injected into the active layer where they recombine to generate light that is emitted omnidirectionally from the active layer and from all surfaces of the LED. Recent advances in LEDs (such as Group III nitride based LEDs) have resulted in highly efficient light sources that surpass the efficiency of filament-based light sources, providing light with equal or greater brightness in relation to input power.

One disadvantage of conventional LEDs used for lighting applications is that they cannot generate white light from their active layers. One way to produce white light from conventional LEDs is to combine different wavelengths of light from different LEDs. For example, white light can be produced by combining the light from red, green and blue emitting LEDs, or combining the light from blue and yellow LEDs.

Light from a single blue emitting LED has been converted to white light by coating the LED with a yellow phosphor, polymer or dye, with a typical phosphor being cerium-doped yttrium aluminum garnet (Ce:YAG). [See Nichia Corp. white LED, Part No. NSPW300BS, NSPW312BS, etc.; See also U.S. Pat. No. 5,959,316 to Lowery, "Multiple Encapsulation of Phosphor-LED Devices"]. The surrounding phosphor material "downconverts" the wavelength of some of the LED's blue light, changing its color to yellow. For example, if a nitride-based blue emitting LED is surrounded by a yellow phosphor, some of the blue light passes through the phosphor without being changed while a substantial portion of the light is downconverted to yellow. The LED emits both blue and yellow light, which combine to provide a white light.

One conventional method for coating an LED with a phosphor layer utilizes a syringe or nozzle for injecting a phosphor containing epoxy or resin over the LED. One disadvantage of this method is that it is often difficult to control the phosphor layer's geometry and thickness. As a result, light emitting from the LED at different angles can pass through different amounts of conversion material, which can result in an LED with non-uniform color temperature as a function of viewing angle. Using the syringe method the geometry and thickness of the epoxy containing the conversion material is hard to control, and as a result, it is difficult to consistently reproduce LEDs with the same or similar emission characteristics.

Another method for coating an LED is by stencil printing, which is described in European Patent Application EP 1198016 A2 to Lowery. Multiple light emitting semiconductor devices are arranged on a substrate with a desired distance between adjacent LEDs. The stencil is provided having openings that align with the LEDs, with the holes being slightly larger than the LEDs and the stencil being thicker than the LEDs. A stencil is positioned on the substrate with each of the LEDs located within a respective opening in the stencil. A composition is then deposited in the stencil openings, covering the LEDs, with a typical composition being a phosphor in a silicone polymer that can be cured by heat or light. After the holes are filled, the stencil is removed from the substrate and the stenciling composition is cured to a solid state.

Like the syringe method above, it can be difficult to control the geometry and layer thickness of the phosphor containing polymer using the stenciling method. The stenciling composition may not fully fill the stencil opening such that the resulting layer is not uniform. The phosphor containing composition can also stick to the stencil opening which reduces the amount of composition remaining on the LED. These problems can result in LEDs having non-uniform color temperature and LEDs that are difficult to consistently reproduce with the same or similar emission characteristics.

Another conventional method for coating LEDs with a phosphor utilizes electrophoretic deposition. The conversion material particles are suspended in an electrolyte based solution. A plurality of LEDs are arranged on a conductive substrate that is then almost completely immersed in the electrolyte solution. One electrode from a power source is coupled to the conductive substrate at a location that is not immersed in the solution, and the other electrode is arranged in the electrolyte solution. The bias from the power source is applied across the electrodes, which causes current to pass through the solution to the substrate and its LEDs. This creates an electric field that causes the conversion material to be drawn to the LEDs, covering the LEDs with the conversion material.

SUMMARY OF THE INVENTION

Basically, and in general terms, the present invention directed to improved systems and methods for electrophoretic deposition (EPD) of materials on semiconductor devices. One embodiment of a system according to the present invention for depositing a material on a semiconductor device, comprises a chamber holding a semiconductor device with the chamber sealed from ambient air. A liquid mixture of deposition material is in said chamber with the mixture also being sealed from ambient air. A voltage supply applies a voltage to the semiconductor device and the mixture to cause the material to deposit on the semiconductor device.

One method according to the present invention for depositing a material on a semiconductor device comprises providing a chamber for holding a semiconductor device, the chamber sealed from ambient air. A mixture of material and solution is provided with the mixture placed in the chamber while being sealed from ambient air. A voltage is applied to the semiconductor device and the mixture to cause the material to deposit on the semiconductor device.

One embodiment of a light emitting diode according to the present invention comprises active semiconductor layers emitting light in response to an electric bias. A layer of conversion material covers at least a portion of the active semiconductor layers with the conversion material converting at least some of the light emitted by the semiconductor layers. The conversion material is deposited on said active layers using close loop electrophoretic deposition (EPD).

One embodiment of a system for depositing a material on a plurality of semiconductor devices also comprises a deposition chamber sealed from ambient air. A mixture of deposition material and solution is in the chamber with mixture also sealed from ambient air. A carrier holds a batch of semiconductor devices with the mixture contacting the areas of the semiconductor devices for material deposition. The semiconductor devices can also come in wafer form as well as individual devices on a carrier. A voltage supply applies a voltage to the semiconductor devices and the mixture to cause the material to deposit on the semiconductor devices at the mixture contacting areas.

These and other aspects and advantages of the invention will become apparent from the following detailed description and the accompanying drawings which illustrate by way of example the features of the invention.

DETAILED DESCRIPTION OF THE INVENTION

Figure 1:
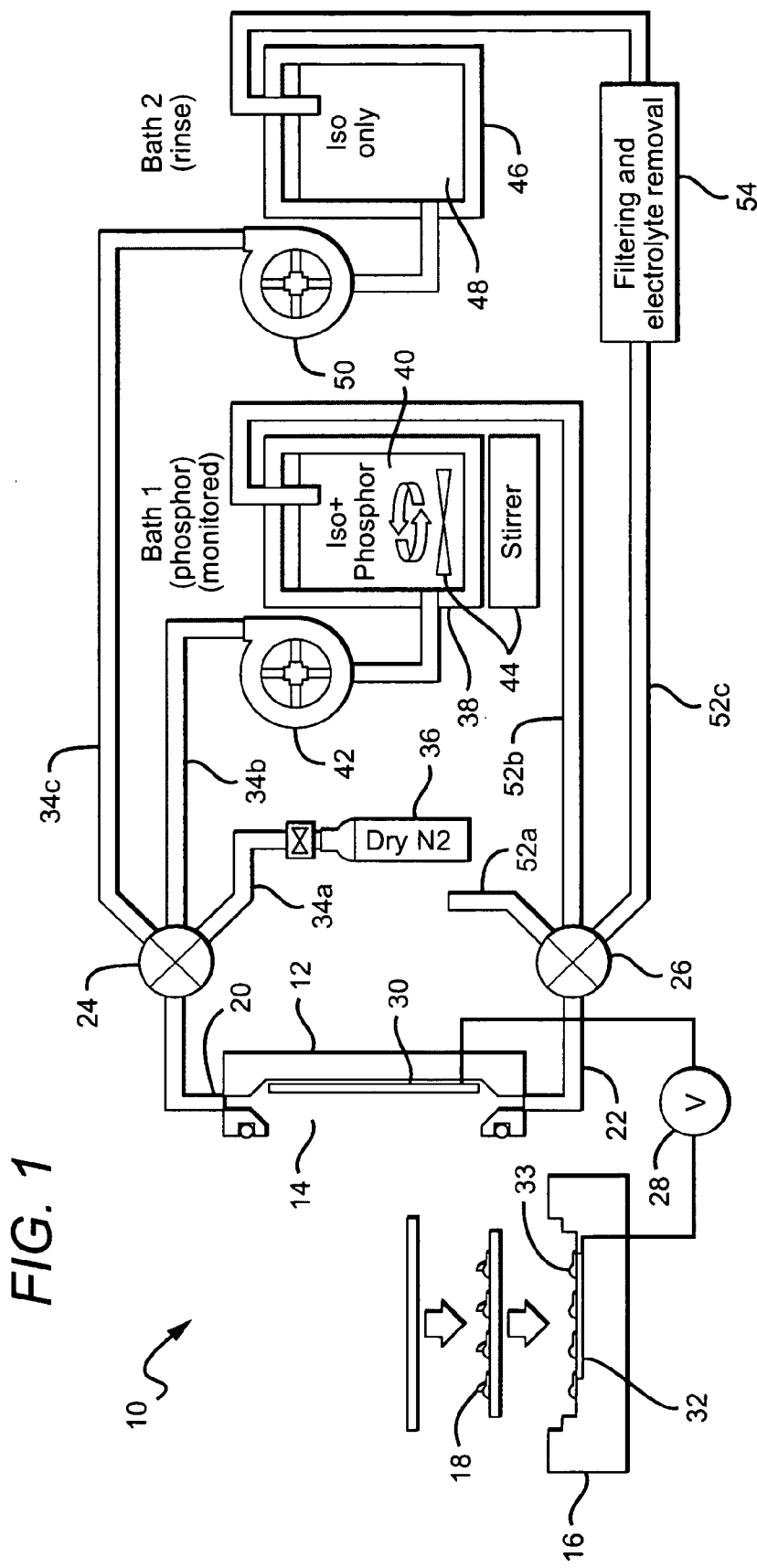
FIG. 1 is a diagram of one embodiment of an EPD system according to the present invention.

The present invention is generally directed to close loop systems and methods for electrophoretic deposition (EPD) of material on semiconductor devices. For purposes of this invention, close loop means that the solution containing the deposition material is not exposed to the ambient prior to or during the EPD process. In some embodiments, the solution is also not exposed to the surrounding ambient after the deposition process so that the solution can be used in subsequent EPD processes.

Close loop systems according to the present invention can deposit materials in solutions that are not contaminated by impurities and contaminants. Particularly, the solutions are free of water or moisture in the form of humidity that in the ambient air can be absorbed by the deposition solution. By being free of impurities and water, a uniform layer of the materials can be deposited on the semiconductor devices with the thickness of the layer being repeatable in subsequent EPD processes.

One embodiment of an EPD system according to the present invention is used to deposit a layer of conversion material on one or more light emitting diode (LED), with the preferred conversion material being phosphors. The EPD system utilizes one or more phosphor mixed in a solution in a close loop arrangement to protect the phosphor/solution combination from the surrounding ambient. This allows the system to deposit a quality, uniform layer of phosphor material on the LED, with the deposition of the layer being repeatable in subsequent deposition processes.

It may also be desirable to incorporate light scattering particles into an LED. Light scattering particles, which act to diffuse light for the purpose of improving the color mixing of LED emitted light and phosphor emitted light, can be added to the LED. The light scattering particles may be mixed into the phosphor deposition, or may be applied separately, prior to or subsequent to the phosphor deposition. Examples of the materials having light scattering particles are SiO2, TiO2, or alumina.

The electrophoretic deposition according to the present invention occurs only onto conductive surfaces of the LED and its mounting elements, which are exposed to the EPD solution. The deposition area can be defined by providing mechanical masks with hole structures as discussed further below.

In another embodiment the electrically conductive area for the EPD deposition is defined by applying a dielectric mask directly onto the LED structure itself (LED device and/or mounting element). Such a mask can be a dielectric coating (i.e. silicon dioxide ($SiO_2$), aluminum oxide ($Al_2O_3$), silicon nitride ($Si_3N_4$) or photo-resist, other silicone or dielectric organic or inorganic coatings. The opening in the respective dielectric mask coating, which exposes all or part of the LED device would define the deposition area during the EPD process.

In another aspect of the invention, the invention relates to a batch EPD processing of semiconductor devices that allows the devices to be encapsulated after EPD processing without further handling that could damage the device or the material deposited on the device. This batch processing is particularly applicable to processing LEDs such that the LED can be covered by a uniform layer of phosphor and then encapsulated without further handling. This batch processing is particularly useful in processing vertical geometry LEDs wherein the pads and wire bonds used to apply an electrical signal to the LEDs can be applied to the LEDs prior to EPD processing. The LEDs can then go directly to encapsulating without further handling.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or component is referred to as being "on" another "connected to" another element or component, it can be directly on or connected to the other element or intervening elements or components may also be present. It will be understood that if part of an element, such as a surface, is referred to as "inner", it is farther from the outside of the device than other parts of the element. Furthermore, relative terms such as "beneath", "below", "top" or "bottom" may be used herein to describe a relationship of one element, layer or region to another element, layer or region. It will be understood that these terms are intended to encompass different orientations of the device in addition to the orientation depicted in the figures. Finally, the term "directly" means that there are no intervening elements.

It will be understood that, although the terms first, second, etc. may be used herein to describe various elements and components, these elements and components should not be limited by these terms. These terms are only used to distinguish one element or component from another.

FIG. 1 shows one embodiment of a close loop EPD system 10 according to the present invention comprising an EPD chamber or bath fixture ("chamber") 12 arranged to deposit a material on semiconductor devices. It is understood that the other systems according to the present invention can take many different forms and can have many different components arranged in many different ways. As shown, the system 10 and chamber 12 are particularly arranged for depositing one or more phosphor on semiconductor devices, and in particular LEDs. The chamber 12 has a vertical orientation to assist in the flow of a phosphor solution through the chamber 12 and to minimize settling of the phosphor particles. In other embodiments, however, the chamber 12 can have other orientations such as angled or horizontal.

The chamber 12 has a carrier opening 14 and the system 10 further comprises a device carrier 16 for holding semiconductor devices 18. The carrier 16 can be arranged in many different ways to hold different semiconductor devices 18, with the carrier 16 as shown arranged to hold a plurality of LEDs to allow batch deposition of material on the LEDs during the EPD process. In the system 10, the LEDs 18 are vertical geometry devices with a lower contact at its lower surface and a wire bond 18a to its upper surface. It is understood, however, that the system 10 can be used with other semiconductor devices, and in particular with lateral geometry LEDs. The carrier 16 has a size and shape that allows it to be mounted to the chamber 12, at the chamber opening 14, with a seal between the carrier 18 and the chamber 12. This allows for the carrier 16 to hold the semiconductor devices 18 vertically in a chamber 12, with the chamber sealed from the ambient air.

The chamber 12 further comprises a chamber inlet 20 and a chamber outlet 22, along with an inlet valve 24 to control gasses or liquids that are introduced into the chamber 12. An outlet valve 26 controls the destination of gasses or liquids leaving the chamber. The input and output valves 24 and 26 have a sealed connection to the chamber inlet 20 and outlet 22, respectively, to prevent introduction of ambient air into the inlet 20 or outlet 22 or the liquid/gas entering or leaving the chamber through the valves. This keeps the chamber sealed from and the liquid/gas free from moisture or other contaminants from the surrounding ambient. The input valve 24 is a single valve that controls the flow of liquid or gas from three sources 34a-c to the chamber inlet 20, and valve 26 controls the flow from a chamber outlet to three outlet lines 52a-c. It is understood, however, that the same control can be provided by more than one valve. For example, the three lines 34a-c providing liquid or gas to the inlet 20 can each have a respective valve to control from its line to the inlet 20. A similar arrangement can be provided at the outlet lines 52a-c from the outlet 22.

The system 10 also comprises a computer controlled voltage source 28 that is coupled across an anode 30 that is vertically arranged in the chamber 12, and a cathode 32 in the carrier 16. The voltage source applies a voltage across the anode 30 and cathode 32 during the EPD deposition process to cause the phosphor in the chamber's phosphor/solution to deposit on the semiconductor devices. The voltage source 28 can apply different voltage levels across the anode 30 and cathode 32 to start and stop the deposition process and control the rate of deposition.

As mentioned, the inlet valve 24 accepts three input lines 34a-c, each coming from a different source and the valve 24 controls which, if any, of the gas/liquid carried in three input lines 34a-c is introduced into the chamber 12. The first input line 34a carries gas from the gas source 36 that can be many different gasses, with suitable gas being Dry $N_2$. The gas source 36 and its connection to input line 34a are sealed so that the gas is not exposed to the surrounding ambient.

The second input line 34b carries liquid from a first bath 38 that preferably holds the material solution mixture 40. Many different solution mixtures can be used with a preferred mixture being a conversion material and solution mixture for depositing a light conversion material on LEDs. In one embodiment according to the present invention, the mixture comprises a phosphor as the conversion material that is mixed in an alcohol solution, although it is understood that other solutions can be used. The alcohol solution can also have electrolytes added to assist in current conduction during the deposition process. In other embodiments, the mixture can comprise more than one phosphor in a solution, with the mixture used to deposit multiple phosphors on the LEDs.

The following is a list of some of the phosphors that can be used alone or in combination as the conversion material, grouped by the re-emitted color that each emits following excitation. It is understood that other phosphors not included in this list can also be used.

Red
$Y_2O_2S:Eu^{3+},Bi^{3+}$
$YVO4:Eu^{3+},Bi^{3+}$
$SrS:Eu^{2+}$ $SrY_2S_4:Eu^{2+}$
$CaLa_2S_4:Ce^{3+}$
$(Ca,Sr)S:Eu^{2+}$
$Y_2O_3:Eu^{3+}, Bi^{3+}$
$Lu_2O_3:Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$Sr_2CeO_4$
$SrTiO_3:Pr^{3+},Ga^{3+}$
Orange
$SrSiO_3:Eu,Bi$
Yellow/Green
$Y_3Al_5O_{12}:Ce^{3+}$
$YBO_3:Ce^{3+},Tb^{3+}$
$BaMgAl_{10}O_{17}:Eu^{2+},Mn^{2+}$
$(Sr,Ca,Ba)(Al,Ga)_2S_4:Eu^{2+}$
$ZnS:Cu^+,Al^{3+}$
$LaPO_4:Ce,Tb$
$Ca_8Mg(SiO_4)_4Cl_2:Eu^{2+},Mn^{2+}$
$((Gd,Y,Lu,Se,La,Sm)_3(Al,Ga,In)_5O_{12}:Ce^{3+}$
$((Gd,Y)_{1-x}Sm_x)_3(Al_{1-y}Ga_y)_5O_{12}:Ce^{3+}$
$(Y_{1-p-q-r}Gd_pCe_qSm_r)_3(Al_{1-y}Ga_y)_5O_{12}$
$Y_3(Al_{1-s}Ga_s)_5O_{12}:Ce^{3+}$
$(Y,Ga,La)_3Al_5O_{12}:Ce^{3+}$
$Gd_3In_5O_{12}:Ce^{3+}$
$(Gd,Y)_3Al_5O_{12}:Ce^{3+},Pr^{3+}$
$Ba_2(Mg,Zn)Si_2O_7:Eu^{2+}$
$(Y,Ca,Sr)_3(Al,Ga,Si)_5(O,S)_{12}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$
Blue
$ZnS:Ag,Al$
Combined Yellow/Red
$Y_3Al_5O_{12}:Ce^{3+},Pr^{3+}$
White
$SrS:Eu^{2+},Ce^{3+},K^+$ From the list above, the following phosphors are preferred for use as the conversion material based on certain desirable characteristics. Each is excited in the blue and/or UV wavelength spectrum, provides a desirable peak emission, has efficient light conversion, and has acceptable Stokes shift.
Red
$Lu_2O_3: Eu^{3+}$
$(Sr_{2-x}La_x)(Ce_{1-x}Eu_x)O_4$
$Sr_2Ce_{1-x}Eu_xO_4$
$Sr_{2-x}Eu_xCeO_4$
$SrTiO_3:Pr^{3+},Ga^{3+}$
Yellow/Green
$Y_3Al_5O_{12}: Ce^{3+}$
$(Sr,Ca,Ba)(Al,Ga)_2S_4:Eu^{2+}$
$Ba_2(Mg,Zn)Si_2O_7:Eu^{2+}$
$Gd_{0.46}Sr_{0.31}Al_{1.23}O_xF_{1.38}:Eu^{2+}_{0.06}$
$(Ba_{1-x-y}Sr_xCa_y)SiO_4:Eu$
$Ba_2SiO_4:Eu^{2+}$ The first bath 38 containing the phosphor/solution mixture, and its connection to input line 34b, are also sealed such that the mixture 40 is not exposed to the ambient air in the bath 30 or input line 34b. The mixture 40 is moved through the second input line 34b by a first closed pump 42 that is also sealed to the ambient air. Depending on the type of material (phosphor) and solution, the material can settle in the first bath 38. To help keep the concentration of material uniform in the solution, the first bath 38 can also comprise a conventional stirrer 44 that helps keep the phosphor material from settling in the solution.

The third input line 34c carries liquid from a second bath 46 that holds the rinsing liquid 48 that can be many different liquids, but is preferably isopropanol. The second bath 46 and its connection to the third input line are also sealed from the ambient air, and the liquid 48 is moved through the third inlet line 34c by a second closed pump 50 that is also sealed from the ambient air.

The outlet valve 26 has three outlet lines 52a-c and the valve 26 is controlled to open the chamber 12 to one (or none) of the outlet lines 52a-c to carry gas/liquid from the chamber 12. The first outlet line 52a is open to the ambient air and serves as a vent when exhausting the contents of the chamber 12. The second outlet line 52b carries liquid to the first bath 38, usually during or after the EPD deposition process. The outlet line 52b has a sealed connection between the valve 26 and the bath 38 so that the mixture 40 carried on line 52b is not exposed to the ambient air, the third outlet line 52c carries liquid to the second bath 46 and usually carries the rinsing liquid 48. The outlet line 52c has a sealed connection between the valve 26 and bath 46 so that the liquid carried in the outlet line is not exposed to the ambient air. A filtering and electrolyte removal system 54 can be included to filter out phosphors and electrolytes in the rinsing liquid after it passes through the chamber 12. This is particularly useful when re-circulating the rinsing liquid during rinsing of the chamber 12. In the embodiment shown, the filtering system 54 is on the outlet line 52c so that liquid from the chamber passing through outlet line 52c passes through the filter. The filter system, however, can be in other locations in the system 10. In another embodiment, the filtering system 54 can be arranged to filter the liquid in the second bath 46, such as by coupling the filtering system 54 to the bath 46. Still in other embodiments, filters can be used that filter out only the phosphor material.

Figure 2:
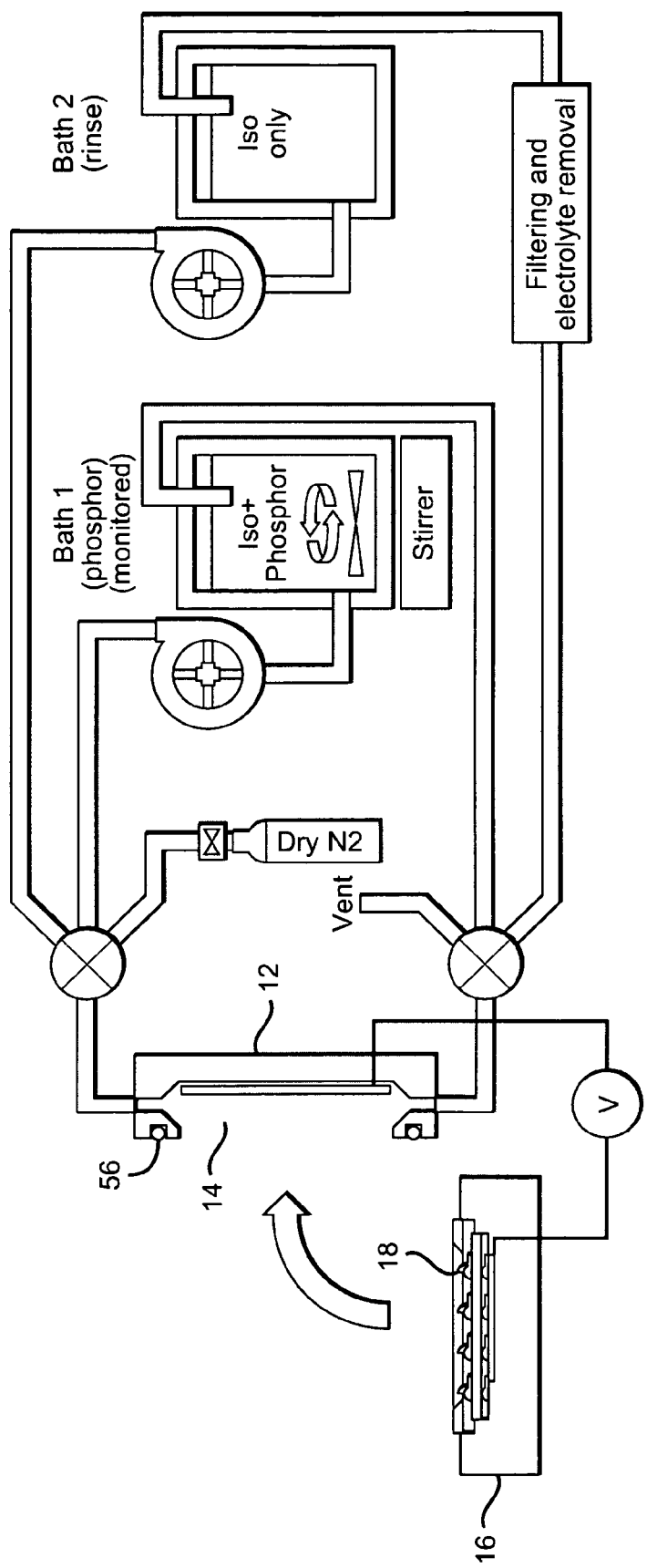
FIG. 2 shows the EPD system in FIG. 1 during mounting of the carrier.

FIGS. 2-7 show the system of FIG. 1 in operation. Referring to FIG. 2, the carrier 16 is mounted to the chamber 12 at the chamber opening 14. A seal is created between the carrier 16 and the chamber 12 such that the chamber 12 is sealed. Many different sealing devices or compounds can be used according to the present invention, such as gaskets or sealant compounds such as silicone or epoxies, with a suitable sealing device being an O-ring 56 around the chamber opening. The carrier can be mounted in place using many different mounting devices such as screws, clamps, brackets, etc., with suitable mounting devices being conventional toggle clamps. When the carrier 16 is mounted in place over opening 15, a close loop system is created, i.e. the gas source 36, baths 38, 46, inlets lines 34a-c, outlet lines 52b-c, inlet 20, outlet 22 and chamber 12 are connected together such that they are sealed from the ambient air. The only line that is open to the ambient air is outlet line 52a used for venting as described below.

Figure 3:
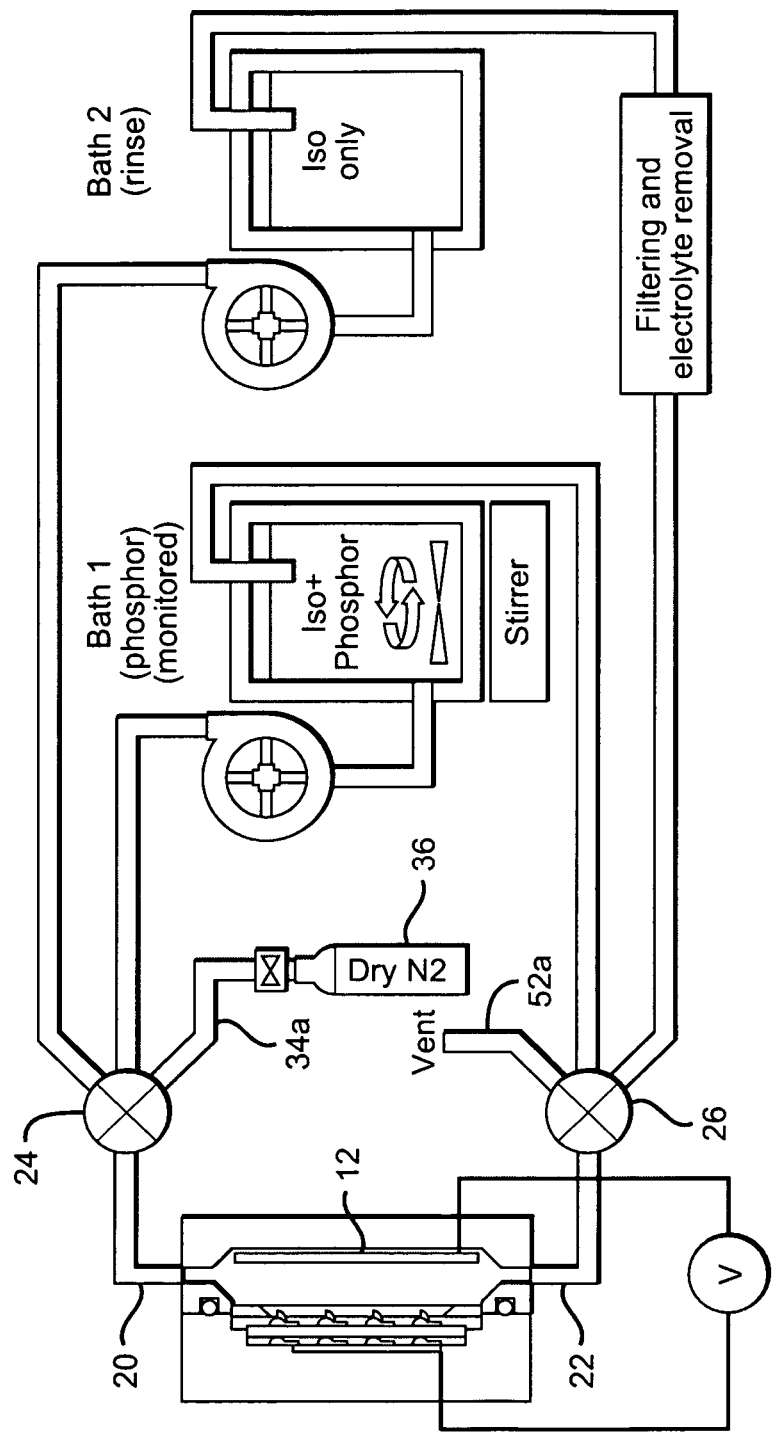
FIG. 3 shows the EPD system of FIG. 2 during a gas purge processing step.

Air is typically trapped in the chamber 12 when the carrier 16 is mounted to the chamber 12, which can introduce unwanted moisture. Moisture can also be on the interior of the chamber 12 or the surfaces of the carrier 12 and semiconductor devices 18 in the chamber. To prevent this trapped moisture air from being introduced into the phosphor solution during the deposition process, this moisture should be purged from the chamber 12. FIG. 3 illustrates one embodiment of this purging step, wherein the gas supply 36 is opened to supply a dry $N_2$ gas to the inlet line 34a. Inlet valve 24 opens the first input line 34a to the chamber inlet 20, and to the chamber 12 which introduces the gas into the chamber 12. The outlet valve 26 opens the chamber outlet 22 to the first outlet line 52a. This allows the dry $N_2$ gas from the gas source 36 to enter the chamber 12 and pass through to eliminate residual moisture in the chamber 12. The $N_2$ gas then passes out of the chamber 12 and is vented from the system 10 through the first outlet 52a. The inlet and outlet valves 24, 26 are typically closed after the purging step is completed.

Figure 4:
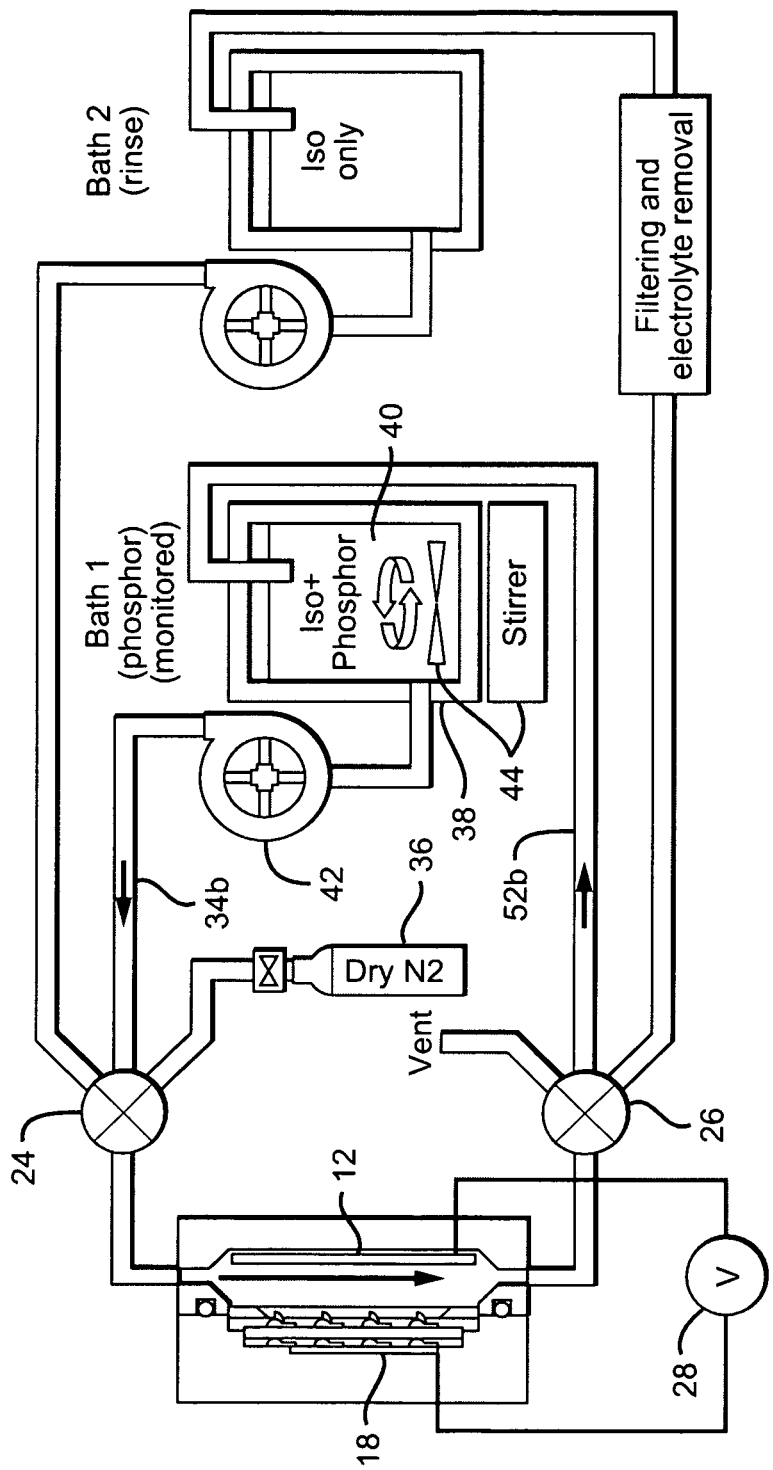
FIG. 4 shows the EPD system of FIG. 2 during phosphor deposition processing step.

Referring now to FIG. 4, after the purging step is complete, the phosphor solution can be introduced into the chamber 12. While the stirrer 44 is operating, the inlet valve 24 opens to the second input line 34b and the outlet valve 26 opens to the second outlet line 52b. This allows the first closed pump 42 to move the phosphor solution 40 from the first bath 38 to the chamber 12, and for phosphor solution passing through the chamber 12 to move back to the first bath 38. During this process a voltage is applied from the voltage source 28 to deposit a phosphor on the semiconductor devices (LEDs) 18. In most embodiments, the flow of the phosphor solution continues during the deposition process to minimize settling of particles during deposition and so that the concentration of phosphors in the phosphor solution is to be maintained. This continuous flow is particularly applicable to depositing films composed of large particle size phosphors or films requiring long deposition times on the LEDs. In other embodiments the chamber can be filled and the flow of phosphor solution stopped during the deposition process by closing the outlet valve 26. This process can be used when the phosphor solution contains fine particles that are suspended in the solution or settle slowly. This process can also be used when depositing thin phosphor layers over a relatively short deposition time so that the deposition can be completed before the particles settle.

Figure 5:
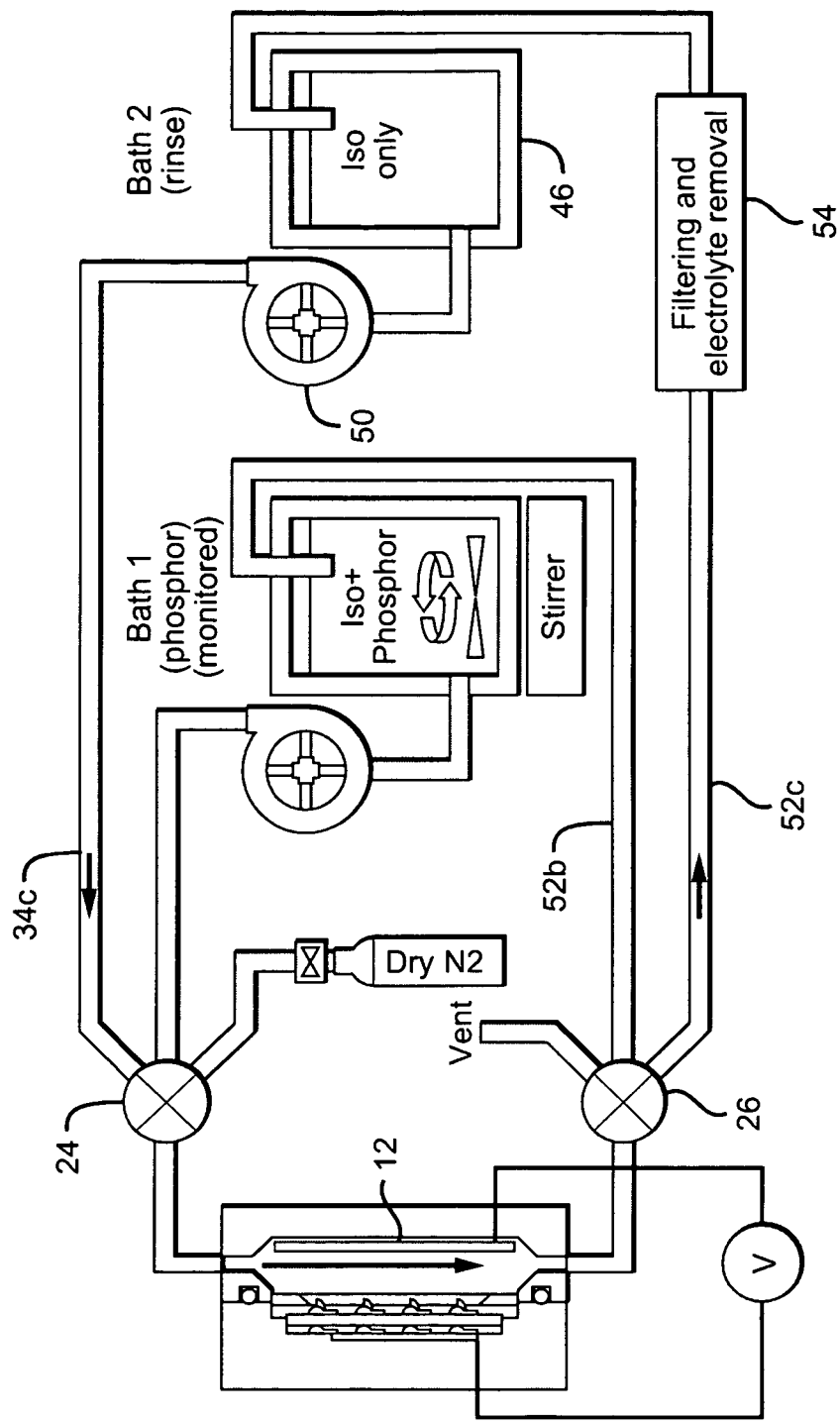
FIG. 5 shows the EPD system of FIG. 2 during a chamber rinse processing step.

Referring now to FIG. 5, after the deposition process is complete, the phosphor solution is drained from the chamber 12 by closing the inlet valve 24 and leaving the outlet valve 26 open to the second outlet line 52b until the chamber 12 is empty. As an optional step, the interior of the chamber 12 can be rinsed to remove any remaining phosphor, with the rinse not being forceful enough to remove the deposited phosphor material on the LEDs. During the rinse process the inlet valve 24 is opened to the third input line 34c and the outlet valve 26 is opened to the third outlet line 52c. This allows the second closed pump 50 (also sealed from ambient air) to move rinsing liquid from the second bath 46 and to flow through the chamber 12. The rinsing liquid is then returned to the second bath 46 with any phosphor or electrolytes being filtered from the rinsing liquid by the filtering system 54.

Figure 6:
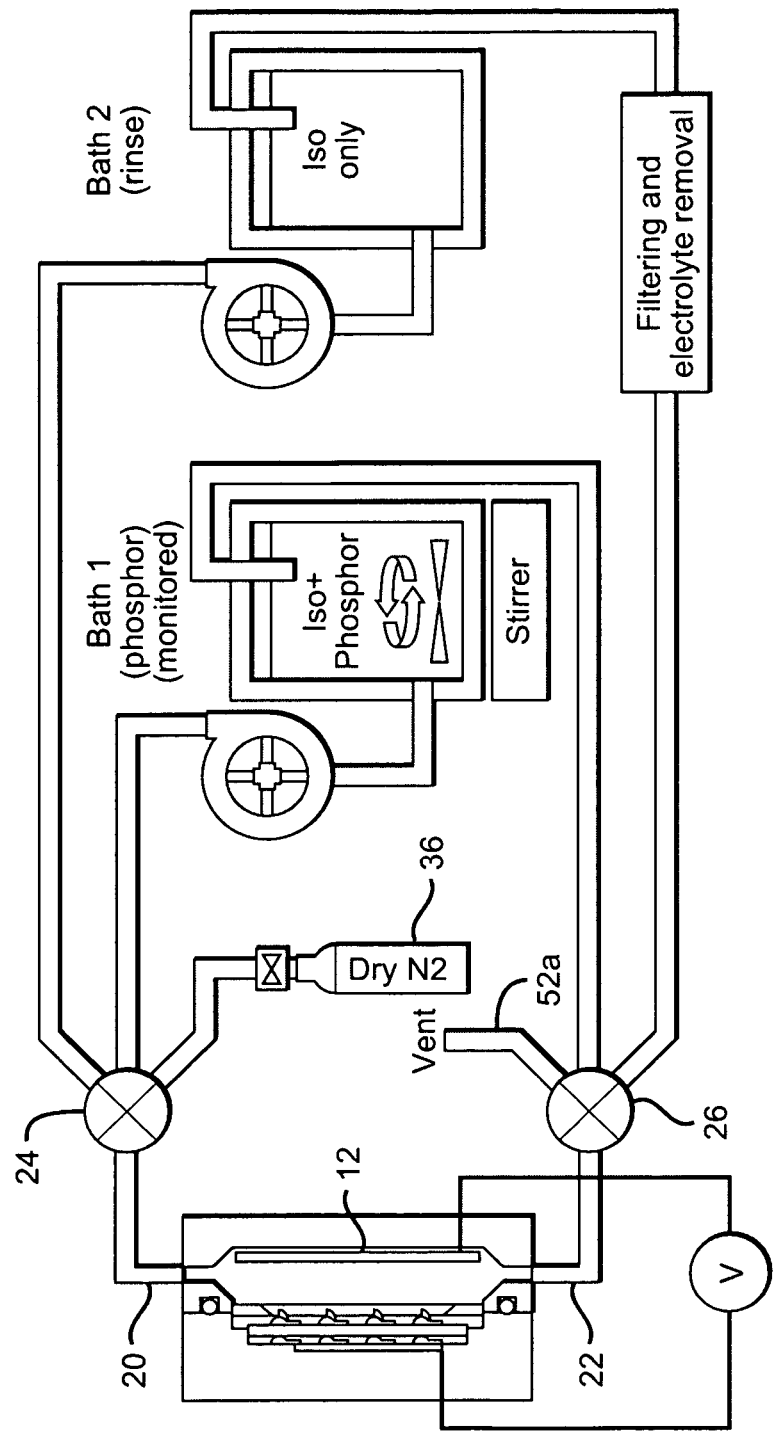
FIG. 6 shows the EPD system of FIG. 2 during another gas purge processing step.
Figure 7:
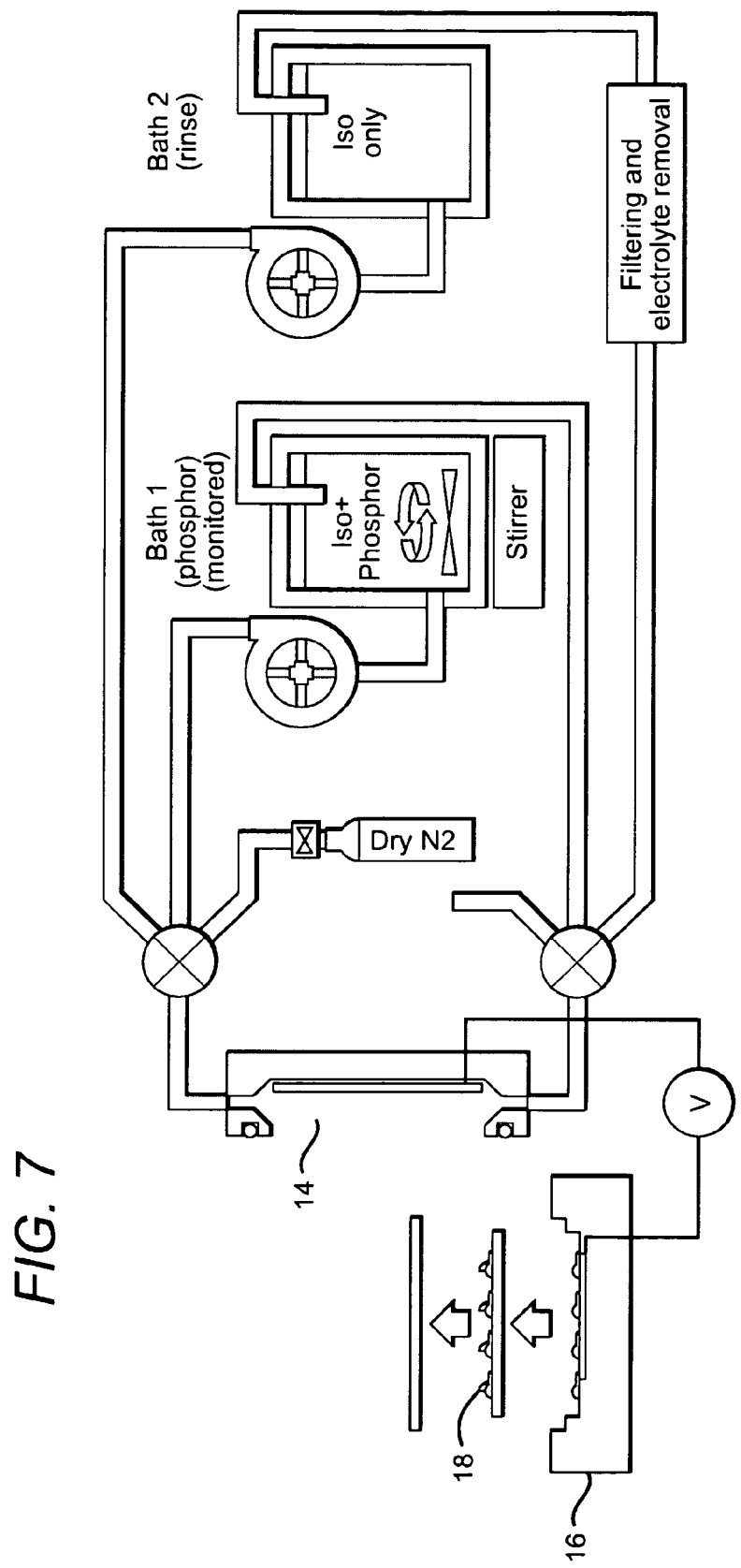
FIG. 7 shows the EPD system of FIG. 6 during a carrier unload processing step.

Referring now to FIG. 6, after the rinsing liquid has been drained from the chamber 12, the chamber 12 can again be purged by the Dry $N_2$ gas using the same process as described above in FIG. 3. This purging step is designed to dry out any residual rinsing liquid and to prevent evaporative cooling and subsequent condensation of water onto the semiconductor devices (LEDs) 18. Referring now to FIG. 7, after purging, the carrier 18 is removed from the chamber opening 14 and the semiconductor devices 18 can be removed from the carrier 16.

Figure 8:
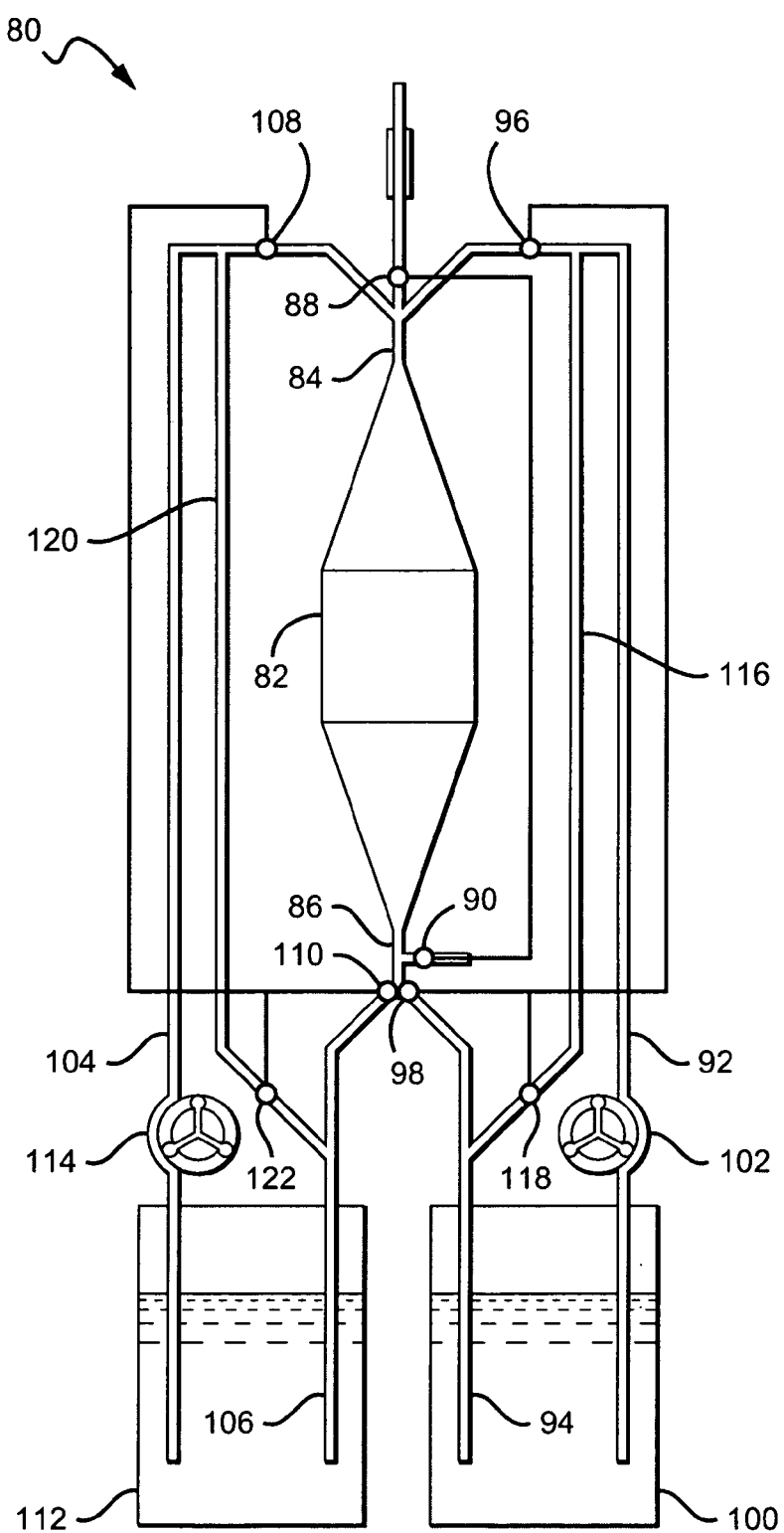
FIG. 8 is a diagram of another embodiment of an EPD system according to the present invention.

FIG. 8 shows another embodiment of an EPD system 80 according to the present invention that operates similar to the system 10 described above in FIGS. 1-7. The system 80 also comprises a vertically oriented chamber that is arranged to hold a carrier and its semiconductor devices vertically. The chamber 82 has a chamber inlet 84 and chamber outlet 86 to allow gas or liquid to enter and exit the chamber 82. In this embodiment there are separate input and output valves for the purge gas and each of the liquids. For the Dry $N_2$ purge gas, a gas input valve 88 is included near the top of the chamber 82, and when the valve 88 is open purge gas enters the chamber 82 through the chamber inlet 84. A gas outlet valve 90 at the bottom of the chamber 82 opens to allow the purge gas to exit the chamber. In other system embodiments, the gas can enter at the bottom of the chamber 82 and exit at the top.

The system 80 also comprises a phosphor solution inlet line 92, a phosphor solution outlet line 94, a phosphor solution inlet valve 96 and a phosphor solution outlet valve 98. The inlet and outlet lines 92, 94 enter a closed first bath 100 holding the phosphor solution. As described above, the bath 100 can have a stirrer (not shown) to keep the phosphor from settling in the solution. The inlet line 92 runs from the bath 100 to the chamber inlet 84. When the inlet valve 96 is open, a closed pump 102 can cause the phosphor solution to move through the inlet line 92 and enter the chamber 82. When the outlet valve 98 is open, the phosphor solution returns to the bath 100.

Similar to the system 10 described above, semiconductor devices 99 are held on a carrier in the chamber opening 101. The chamber 82 further comprises an anode (not shown) arranged in the chamber 82 and a cathode (not shown) in the carrier. While the phosphor solution runs through the chamber, a voltage can be applied across the anode and cathode to cause deposition of phosphor on the semiconductor devices 99.

The system 80 also comprises a rinsing inlet line 104, rinsing outlet line 106, a rinsing inlet valve 108 and a rinsing outlet valve 110. The inlet and outlet lines 104, 106 enter a closed second bath 112 holding a rinsing liquid. After deposition of the phosphor material on the semiconductor devices and draining of the phosphor solution from the chamber 82, the chamber can be rinsed. When the inlet valve 108 is open, a second closed pump 114 can cause the rinsing liquid to move through the inlet line 104 and enter the chamber 82. When the outlet valve 110 is open, the rinsing liquid returns to the bath 112 through the outlet line 106. A filtering system can be included on the outlet line 106 to remove phosphors and electrolytes from the rinsing liquid.

The system 80 includes a circulating path for the phosphor solution and rinsing liquid that allows the two to continue moving through most of their respective inlet lines without entering the chamber 82. A phosphor solution circulating line 116 and phosphor circulating valve 118 are used to keep the phosphor solution circulating. In this operating mode, the phosphor solution inlet valve 96 is closed and the phosphor closed pump moves the phosphor solution through the inlet line 92 until it reaches the inlet valve 96. At that point the phosphor solution moves through the phosphor circulating line, back to the bath 100 through the open phosphor circulating valve 118. The rinsing liquid circulating line 120 and valve 122 work similarly with the rinsing liquid inlet valve 108, inlet line 106 and pump 114 to circulate the rinsing liquid. This arrangement allows for the rinsing liquid and phosphor liquid to be moving through their respective inlet lines such that the chamber 82 will experience quick introduction of the liquids when the desired inlet valves are open.

The system 80 can also include many other features beyond those shown in FIG. 8. The chamber 82 can include structures that disperse the phosphor solution as it enters the chamber to provide for more uniform distribution of the phosphor particles in the phosphor solution passing by the semiconductor devices. Accordingly, the invention is not limited to the system as shown or the features included.

Figure 9:
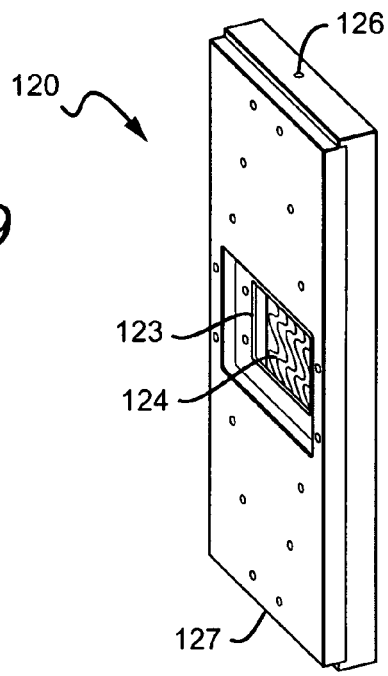
FIG. 9 is perspective view of one embodiment of a chamber according to the present invention that can be used in the systems shown in FIGS. 1-8.
Figure 10:
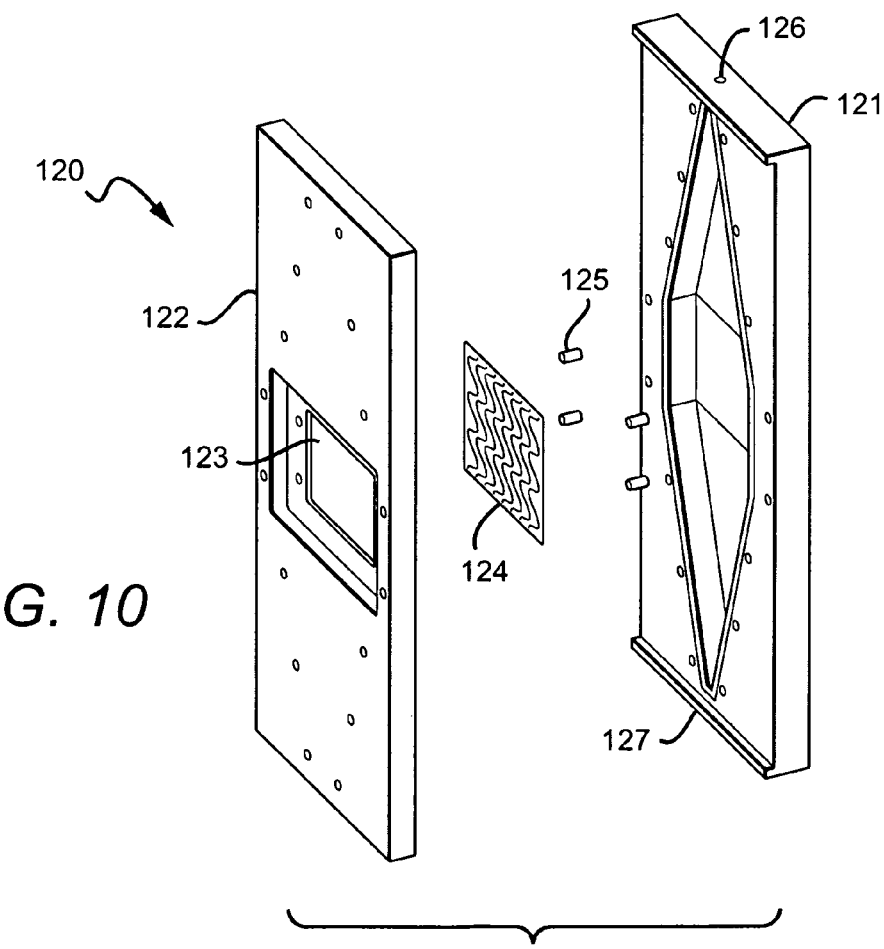
FIG. 10 is a perspective exploded view of the chamber shown in FIG. 9.

FIGS. 9 and 10 show one embodiment of a chamber 120 according to the present invention that can be used in the system 10 and 80 described above and shown in FIGS. 1-8. The carrier is preferably arranged vertically and has back 121 and front 122 that are mounted. The front has an opening 123 to accept a carrier having a number of semiconductor devices such as LEDs. An anode 124 is mounted to the back 121 on standoffs 125 that provide separation between the anode 124 and the back. This separation brings the anode 124 in closer proximity to the LEDs for more uniform and efficient phosphor deposition. Many different types of anodes can be used and/or arranged in different ways, such as a metal plate also arranged on standoffs, or as shown, a metal mesh on standoffs. The mesh can allow for a more uniform deposition of phosphor materials by allowing the phosphor material to pass through the mesh openings during the deposition process. At the same time the mesh provides substantially the same electric field in the chamber compared to a plate, when a voltage is applied across the anode and cathode.

The carrier 120 further comprises an inlet 126 at its top, and an outlet 127 at its bottom, with the inlet 126 allowing gas or liquid to pass into the chamber and the outlet 127 allowing the same to pass out. The chamber also includes clamps (not shown), such as toggle clamps, that are typically mounted around the opening 123 and used to hold the carrier in the opening with a seal between the tow.

The close loop EPD systems 10 and 80 described above can be used to deposit phosphor materials on one or a plurality of semiconductor devices. Referring again to FIGS. 1-7, the system 10 is particularly adapted to depositing phosphor materials on a plurality of LEDs 18 that are mounted in a carrier with contacts (projections) each of which is arranged to make electrical contact with one of the LEDs 18 to carry the electric signal from the cathode 32 to the LEDs 18. In the system 10 the contacts are spring contacts 33 that carry the cathodes electric signal and provide an upward force on the LEDs. A mask 35 can also be included over the LEDs 18 having openings where the phosphor is deposited on the LEDs 18 only in the openings. In one embodiment, the LEDs 18 can be mounted to submounts, and the opening allow phosphor deposition on the LEDs and the area on the submount in the vicinity of the LEDs. This simultaneous deposition of phosphors on a plurality of LEDs is commonly referred to as batch processing.

Figure 11:
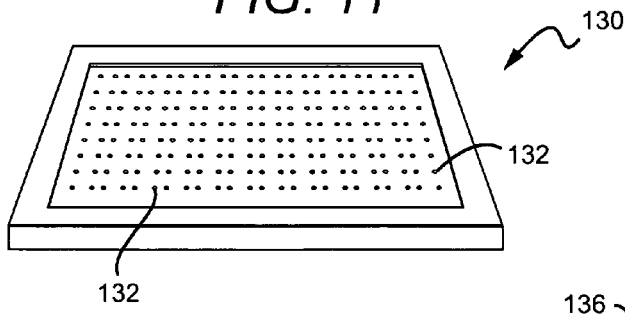
FIG. 11 is a perspective view of one embodiment of carrier bottom fixture according to the present invention.

Referring now to FIGS. 11-15, one embodiment of batch processing device according to the present invention is shown that is adapted for use in a close loop EPD system according to the present invention. The bottom fixture 130 is shown in FIG. 11, having an array of spring loaded contacts 132, arranged so that each will contact a respective one of the LEDs during phosphor deposition. The bottom fixture is electrically connected to the cathode and arranged so that each of the spring loaded contacts carries the electric signal from the cathode. When a bias is applied to the cathode at the carrier, it is transmitted through the bottom fixture 130, through the spring loaded contacts 132, and to the LEDs.

Figure 12:
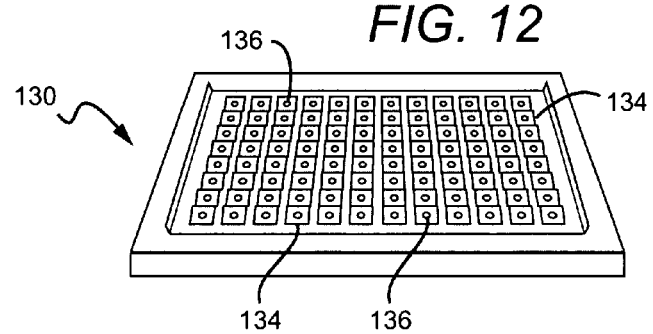
FIG. 12 is a perspective view of the carrier bottom fixture of FIG. 9 with LED substrates.
Figure 13:
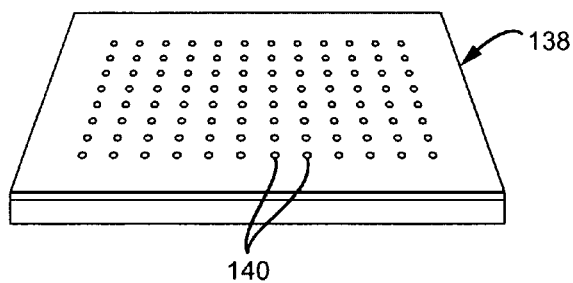
FIG. 13 is a perspective view of a carrier top fixture mounted over the carrier bottom fixture and LED substrates of FIG. 12.

FIG. 12 shows an array of LEDs mounted substrates/submounts 134 and arranged on the bottom fixture 130 with each of the spring loaded contacts in electrical contact with a respective one of the LED submounts 134. Each of the LED submounts 134 has a centrally mounted LED 136 with the necessary wire bonding. Referring now to FIG. 13, the carrier is completed by a top fixture 138 that is mounted in place over the LED submounts 134 by pins or screws. The top fixture 138 has an array of LED holes 140, each of which is aligned over a respective one of the LEDs 136, as best shown in FIG. 12. Each of the LED holes 140 also has an O-ring 142 to provide a seal between each of the holes and its respective LED substrate 134.

Figure 14:
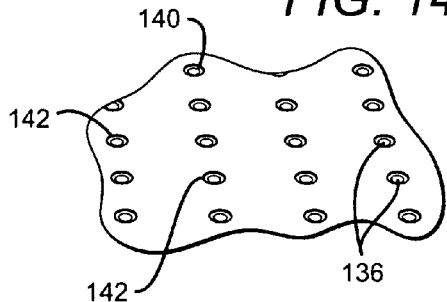
FIG. 14 is a perspective view of the LED substrates and LEDs exposed through the top fixture LED holes.
Figure 15:
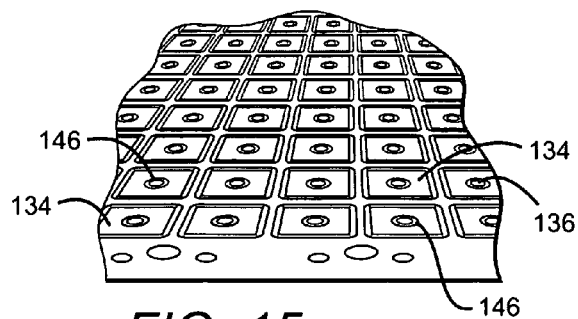
FIG. 15 is a perspective view of the LED substrates after deposition of the phosphor material on the exposed substrates.

The carrier as shown in FIG. 14 is mounted into the chamber in the EPD systems. During the EPD deposition process, the phosphor material is deposited only on those areas of the LED submounts 134 and LEDs 136 exposed by the LED holes 140. The O-rings 142 prevent the phosphor solution from being deposited in other areas of the LED substrates. Referring now to FIG. 15, after processing, the top fixture can be removed to reveal the LED submounts 134. As shown, the phosphor material is only deposited on the portion of the LED substrates 134 exposed through the holes 140, including the LEDs 136.

The batch processing carrier is particularly adapted to processing many LEDs in one run, with the phosphor material only being deposited in the desired area. This method also allows for the deposition of phosphor material on an LED after it is mounted to substrate and wire bonded. The processing is useful for coating vertical geometry LEDs after wire bonding, which further allows the LEDs to go from phosphor deposition to encapsulation without further handling.

Figure 16:
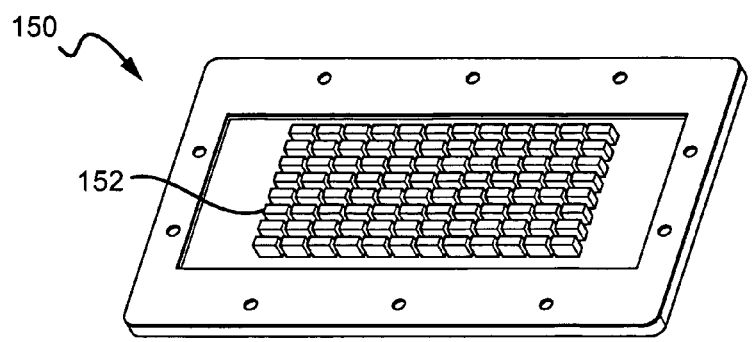
FIG. 16 is a perspective view of another carrier bottom fixture according to the present invention.
Figure 17:
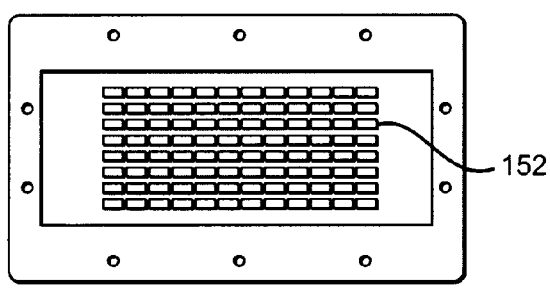
FIG. 17 is a top view of the carrier bottom fixture shown in FIG. 16.
Figure 18:
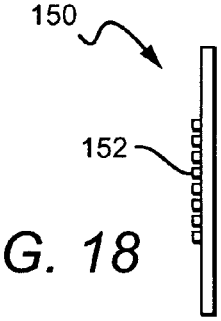
FIG. 18 is side view of the carrier bottom fixture shown in FIG. 16.

The carrier can be arranged in a plurality of LEDs in many different ways using many different components. FIG. 16-18 show another embodiment of a carrier bottom fixture/plate 150 according to the present invention. Instead of utilizing spring contacts, the bottom fixture 150 comprises a plurality of individual posts 152 each of which has a flat top surface that allows a respective LED substrate (not shown) to sit on the flat surface of its post during phosphor deposition. The bottom fixture 150 can be made of many different materials but is preferably made of a conductive material, such as copper. This allows for the electric signal from the cathode to be coupled to the bottom plate and the cathodes electric signal transmitted to the LED substrate through the posts.

Figure 19:
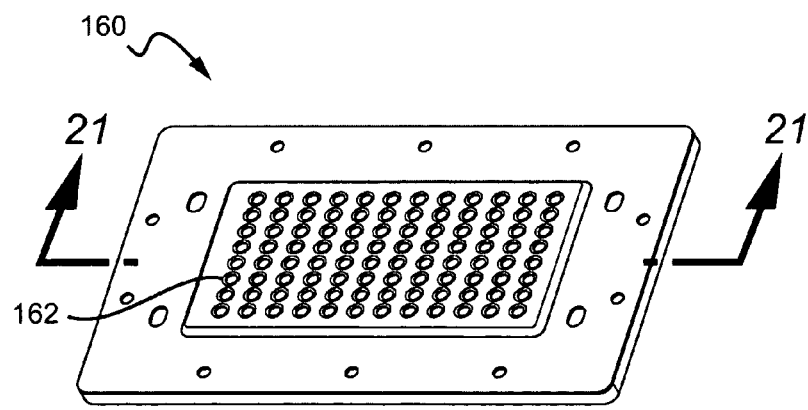
FIG. 19 is a perspective view of another carrier top fixture according to the present invention.
Figure 20:
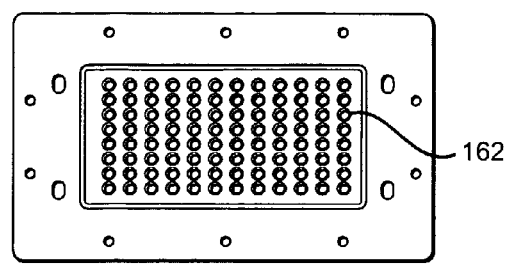
FIG. 20 is top view of the top fixture shown in FIG. 19.
Figure 21:
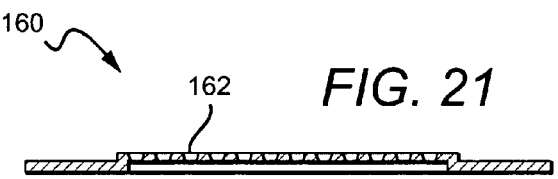
FIG. 21 is a sectional view of the top fixture shown in FIG. 19 taken along section lines 21-21.
Figure 22:
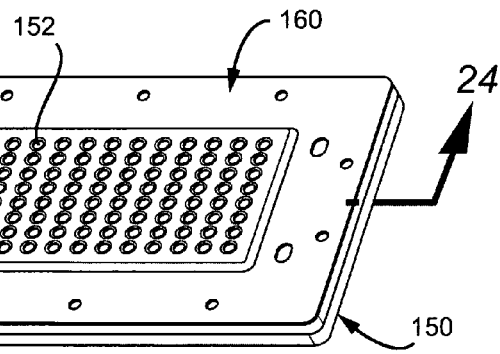
FIG. 22 is a perspective view of the assembly of the top fixture mounted shown in FIGS. 19-21 mounted to the bottom fixture shown in FIGS. 16-18.
Figure 23:
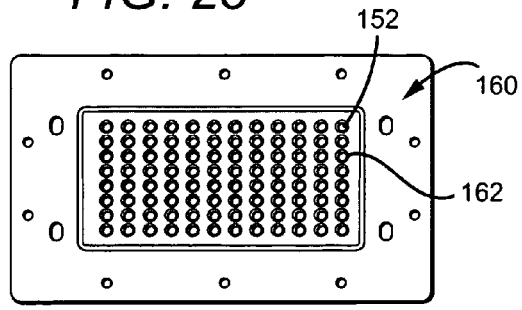
FIG. 23 is a top view of the assembly shown in FIG. 22.
Figure 24:
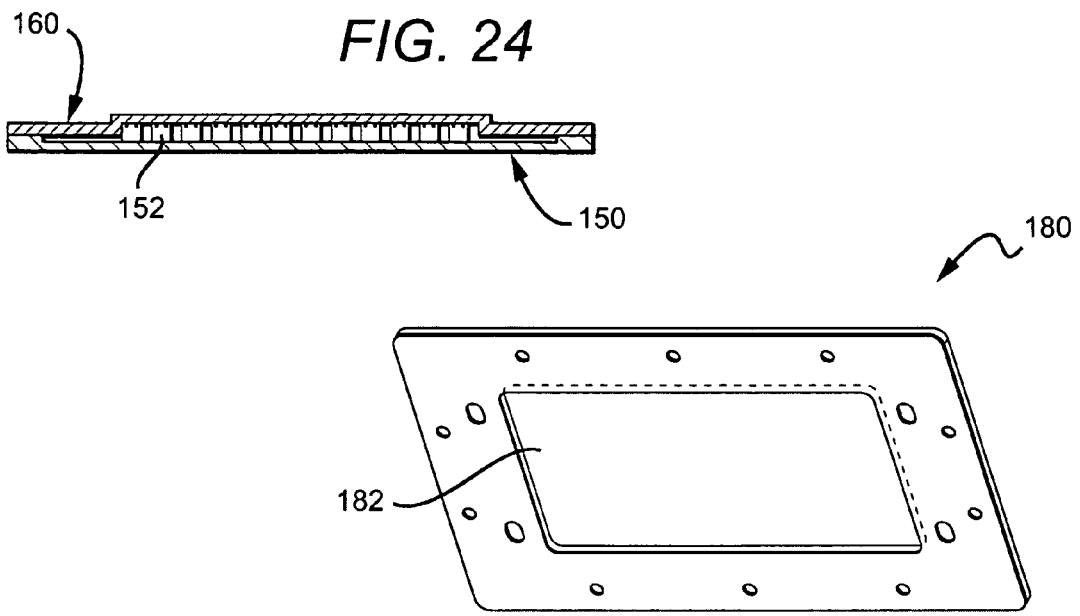
FIG. 24 is a sectional view of the assembly shown in FIG. 22 taken along section lines 24-24.

FIGS. 19-21 show another embodiment of a carrier top plate 160 according to the present invention having LED holes 162. As shown in FIGS. 22-24, the top plate 162 is positioned on the bottom plate 150 with each of the LED holes 162 aligned with one of the bottom plate posts 152. Each of the posts 152 holds a respective one of the LED substrates and when the top plate 160 is mounted to the bottom plate 150, a portion of each of the submounts is sandwiched between its one of the posts 152 and the surface surrounding its one of the holes 162. The LED on each of the LED submounts is arranged in its one of the holes 162 and a sealing device, such as an O-ring, can be included to provide a seal around each of the holes 162 and the LED submount. During phosphor deposition, the phosphor material is deposited on the LED and the area of the submount exposed through the top plate holes 162. The top plate 160 can be made of many different materials, with a suitable material being anodized aluminum. The top plate 160 can also be mounted to the bottom plate using many conventional mounting methods such screws, clamps, brackets, etc.

The carrier can have additional components to further enhance uniform deposition of phosphors according to the present invention. For example, in some embodiments the magnitude of the electric field at the edges of the anode and cathode can be higher than at their center. The electric field between the anode and cathode drives deposition of the phosphor material, so in some instances more phosphor can deposit at the edges where the electric field can be stronger. This can lead to non-uniformity of deposition at the semiconductor devices connected to the cathode.

Figure 25:
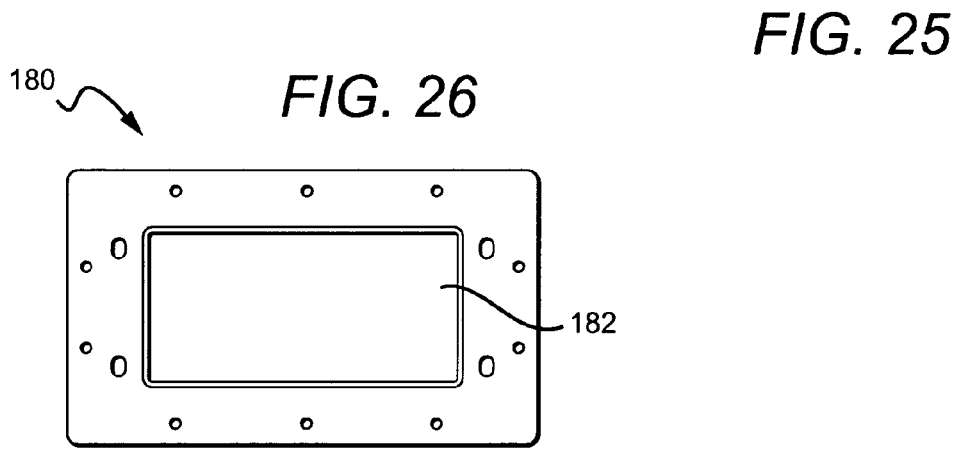
FIG. 25 is a perspective view of one embodiment of a cathode field plate according to the present invention.
Figure 26:
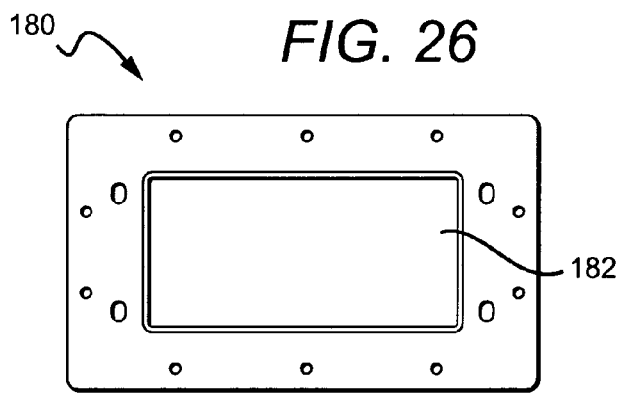
FIG. 26 is a top view of the cathode field plate shown in FIG. 25.

FIGS. 25-29 show one embodiment of a device arranged to address this potential problem. Referring first to FIGS. 26 and 25, a cathode field plate 180 is shown that is designed to be mounted on a carrier to reduce the edge effect at the cathode. The field plate 180 has an opening 182 sized so that the field plate 180 can be placed on the top surface of the carrier with the LEDs in the opening. The field plate 180 can be made of many different materials, but is preferable made of stainless steel.

Figure 27:
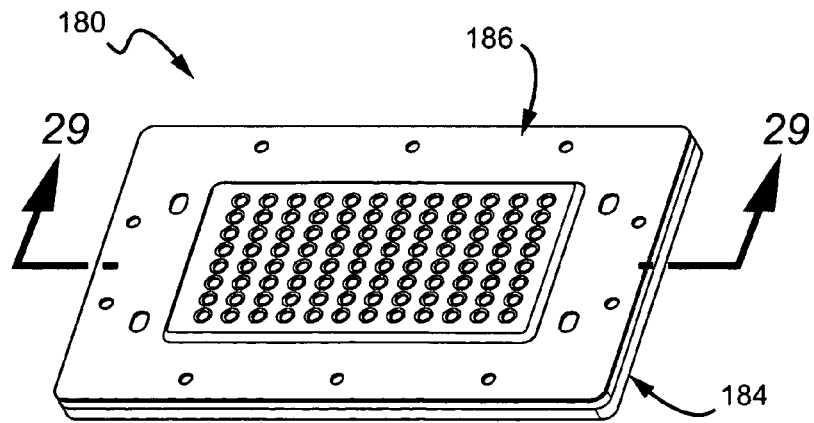
FIG. 27 is a perspective view of the carrier shown in FIGS. 22-25 with the cathode field plate of FIG. 25 mounted to it.
Figure 28:
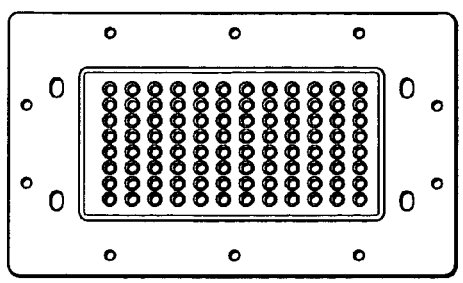
FIG. 28 is a top view of the carrier shown in FIG. 27.
Figure 29:
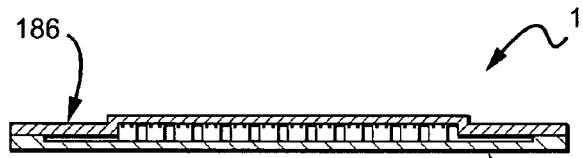
FIG. 29 is a sectional view of the carrier shown in FIG. 27 taken along section lines 29-29.

FIGS. 27-29 show the cathode field plate 180, the carrier bottom plate 184, and carrier top plate 186. During the deposition process, the field plate draws most of the edge effect electric field so that it is applied to the field plate, not the cathode and LEDs connected to the cathode. This results in a more uniform electric field across the LEDs and more uniform deposition of phosphors on the LEDs.

Carriers and EPD systems according to the present invention can be arranged in many different ways beyond those described above. In one embodiment, the carrier can be arranged to accommodate more than one batch of LEDs. In such a system, the chamber can have a single anode and cathode to apply an electric field to the LEDs. Alternatively, the system can have more than one anode and/or cathode to apply different electric fields to the batches or to apply different electric fields to one of the batches.

Figure 30:
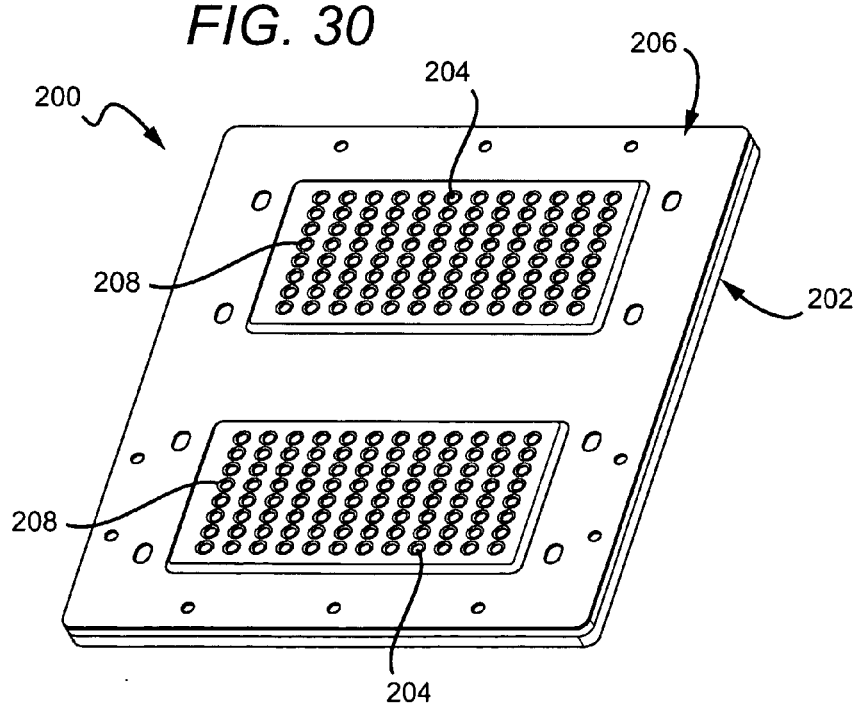
FIG. 30 is a perspective view of a multiple batch carrier according to the present invention.

FIG. 30 shows one embodiment of a multiple batch carrier 200 according to the present invention having a bottom plate 202, with two sets of posts 204, and a top plate 206 with two sets of holes 208. Each of the holes 208 is aligned with a respective one of the posts to hold an LED substrate as described above. By having two sets of posts 204 and holes 208, more LEDs can be processed per phosphor deposition run. This arrangement could require a larger opening in the deposition chamber to accommodate the larger carrier. The anode and cathode may also be larger or multiple anodes and cathodes can be used. The carrier 200 can also comprise a field plate (not shown) to promote a more uniform electric field applied to the LEDs.

Although the present invention has been described in detail with reference to certain preferred configurations thereof, other versions are possible. For example batch system described above can be arranged to be used in other EPD systems beyond those according to the present invention. The EPD systems described above are only two examples of the many different embodiments of EPD systems according to the present invention. As mentioned the systems and batch processing according to the invention can be used to coat many different types of semiconductor devices (e.g., lasers, Schottky diodes, vertical-cavity surface-emitting laser, etc.) with different materials beyond those described above. Other modifications can be made without departing from the spirit and scope of the invention.

We claim:

1. A method for depositing a material on a semiconductor device, comprising:
   providing a chamber for holding a semiconductor device, said chamber sealed from ambient air;
   providing a mixture of material and solution, said mixture placed in said chamber while being sealed from ambient air;
   applying a voltage to said semiconductor device and said mixture to cause said material to deposit on said semiconductor device; and
   providing a rinsing liquid, said rinsing liquid placed in said chamber without exposing said rinsing liquid to ambient air, wherein said device remains stationary relative to the chamber while said mixture is provided and throughout the duration of providing said rinsing liquid.

2. The method of claim 1, wherein said semiconductor device comprises a light emitting diode (LED).

3. The method of claim 1, wherein said material comprises at least one layer of one or more phosphors.

4. The method of claim 1, wherein said material comprises at least one layer of one or more substances having light scattering particles.

5. The method of claim 1, wherein said material has at least one layer of one or more phosphors and at least one layer of one or more substances having light scattering particles.

6. The method of claim 1, further comprising stirring said mixture prior to placing said mixture in said chamber.

7. The method of claim 1, further comprising returning said mixture to a first bath without exposing said mixture to ambient air.

8. The method of claim 1, further comprising allowing said rinsing liquid to exit from said chamber.

9. The method of claim 8, wherein said rinsing liquid exits said chamber without exposure to ambient air.

10. The method of claim 8, further comprising filtering said rinsing liquid after exiting said chamber.

11. The method of claim 1, further comprising providing a gas to said chamber to purge moisture and contaminants from said chamber.

12. The method of claim 11, further comprising venting said gas from said chamber.

13. The method of claim 1, wherein said mixture is circulated through a path outside said chamber before entering said chamber.

14. The method of claim 1, wherein said mixture continuously flows through said chamber while said material deposits on said semiconductor device.

15. The method of claim 1, wherein said mixture is static in said chamber while said material deposits on said semiconductor device.

16. The method of claim 1, wherein said mixture is sealed from ambient air and not exposed to ambient air.

17. The method of claim 1 wherein said rinsing liquid is sealed from ambient air and not exposed to ambient air.

* * * * *